United States Patent [19]

Michelson

[11] 4,405,831
[45] Sep. 20, 1983

[54] APPARATUS FOR SELECTIVE NOISE SUPPRESSION FOR HEARING AIDS

[75] Inventor: Robin P. Michelson, Redwood City, Calif.

[73] Assignee: The Regents of The University of California, Berkeley, Calif.

[21] Appl. No.: 219,342

[22] Filed: Dec. 22, 1980

[51] Int. Cl.³ .................... H04B 15/00; H04R 25/00
[52] U.S. Cl. .................... 179/1 P; 179/1 A;
 179/1 F; 179/1 VL; 179/107 FD
[58] Field of Search ............... 179/1 F, 1 P, 1 VL,
 179/1 AT, 107 R, 107 FD, 1 A

[56] References Cited

U.S. PATENT DOCUMENTS

| | | | |
|---|---|---|---|
| 3,229,049 | 1/1966 | Goldberg | 179/107 FD |
| 3,231,686 | 1/1966 | Hueber | 179/107 FD |
| 3,290,442 | 12/1966 | Suganuma | 179/1 P |
| 3,497,622 | 2/1970 | Markin et al. | 179/1 VL |
| 3,818,149 | 6/1974 | Stearns et al. | 179/107 FD |
| 3,920,931 | 11/1975 | Yanick, Jr. | 179/107 FD |
| 3,928,733 | 12/1975 | Hueber | 179/107 R |
| 4,118,604 | 10/1978 | Yanick | 179/107 FD |
| 4,119,814 | 10/1978 | Harless | 179/107 FD |
| 4,170,720 | 10/1979 | Killion | 179/107 R |
| 4,254,303 | 3/1981 | Takizawa | 179/1 P |

Primary Examiner—G. Z. Rubinson
Assistant Examiner—Randall P. Myers
Attorney, Agent, or Firm—Limbach, Limbach & Sutton

[57] ABSTRACT

Noise suppression apparatus is interposed between the transducer and the amplifier of a hearing aid, allowing the user to adjust the operation of an automatic level control circuit to provide suppression of background sounds with negligible effect on audibility of close-in sounds.

5 Claims, 3 Drawing Figures

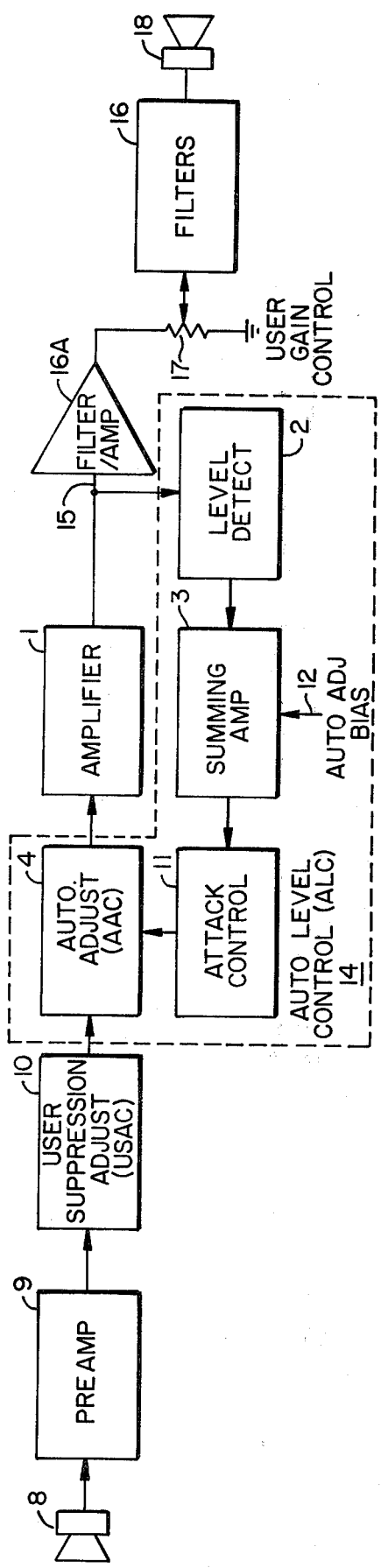
FIG._1.
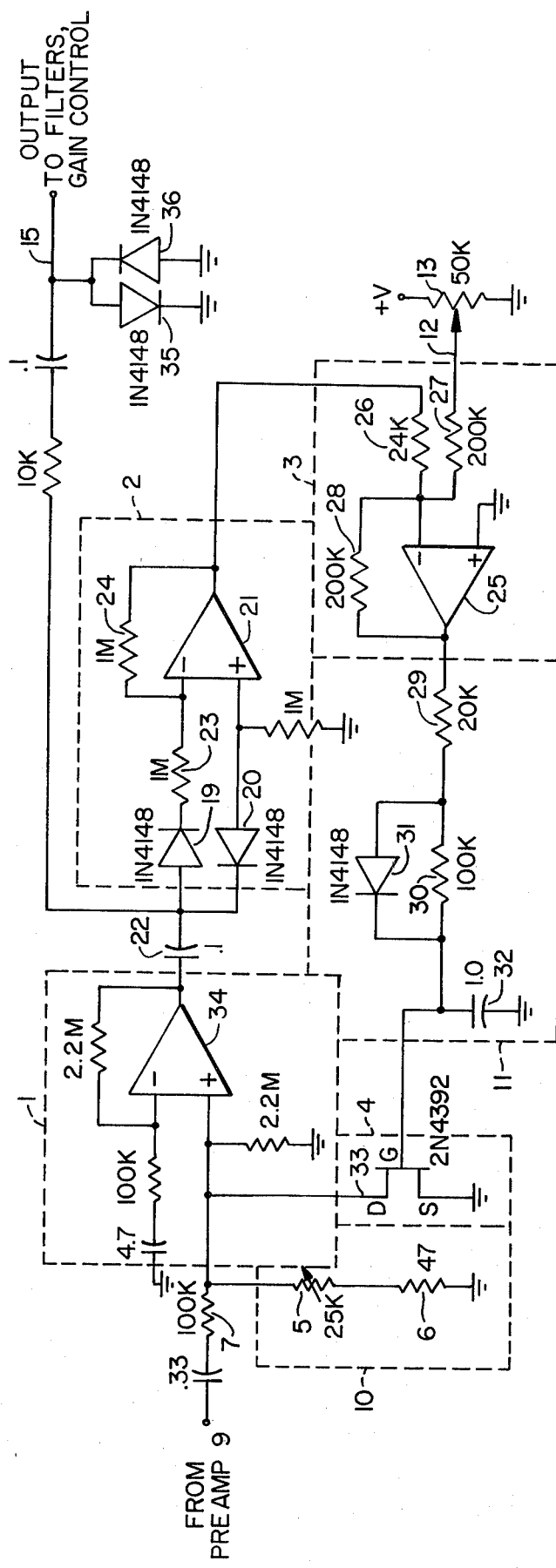
FIG._2.

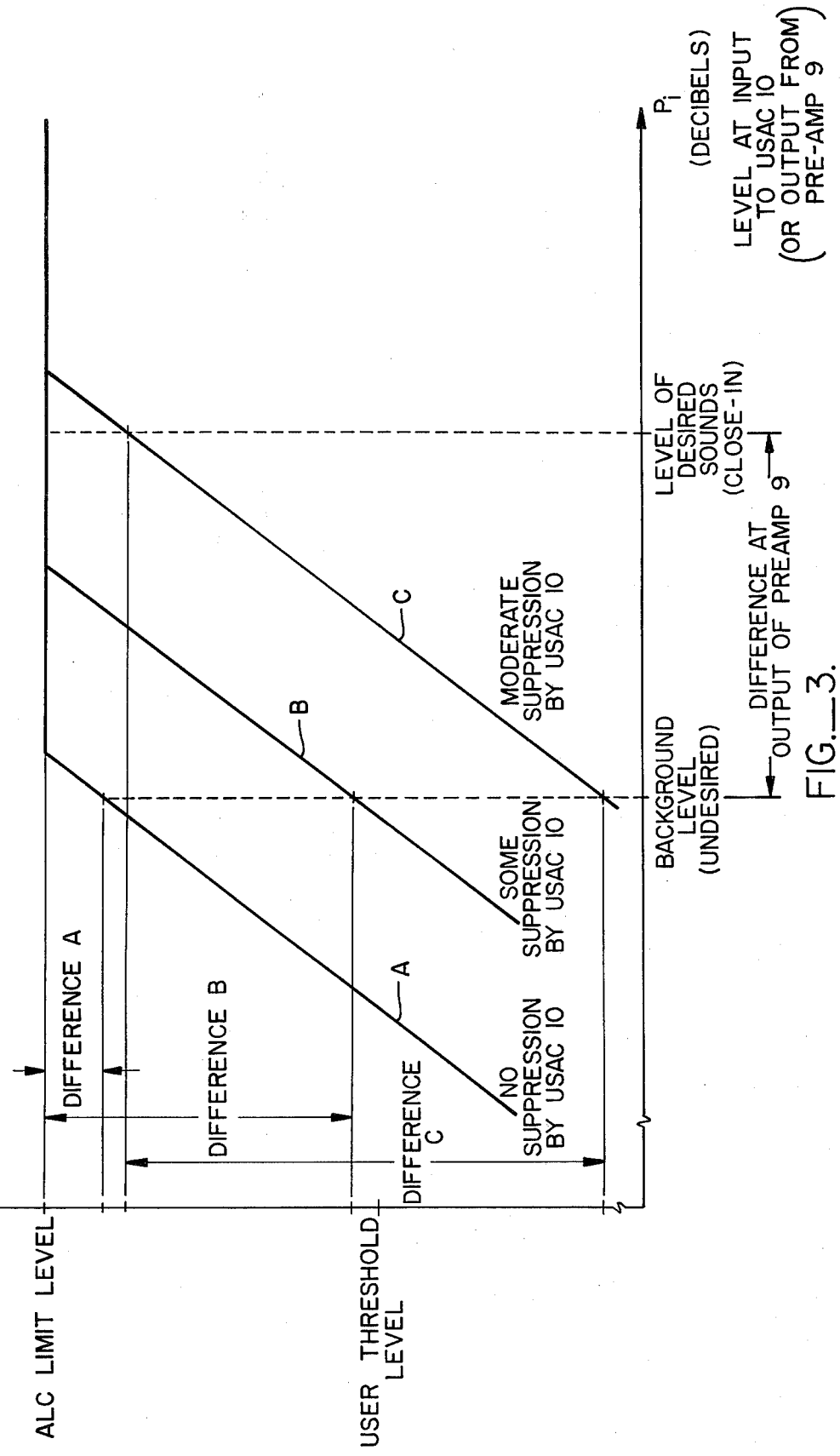

APPARATUS FOR SELECTIVE NOISE SUPPRESSION FOR HEARING AIDS

BACKGROUND OF THE INVENTION

A common complaint of hearing aid users is that close-in sounds of interest and background sounds run together and cannot be distinguished from one another. Therefore, at cocktail parties, for example, the hearing aid user is often unable to carry on a conversation.

It is well known that persons with hearing loss, unlike persons with normal hearing, are often unable to unconsciously or consciously suppress background sounds. As such, what is unnoticeable to persons with normal hearing can be an irritating and annoying barrage to persons using hearing aids, especially hearing aids having automatic gain or level controls. This is so because the gain or level control circuits used are not designed to discriminate between close-in and background sounds. Both types of circuits operate to maintain specific output levels over a range of input sound levels. Often, the levels of sound present are large enough so that even the background sounds are amplified to near maximum output levels. As a result, the user's inability to discriminate between close-in and background sound is aggravated.

In the past, attempts have been made to remedy this bothersome phenomena. One method is to switch off the amplifying circuits of the hearing aid when sound pressure levels (SPL) fall below a predetermined threshold, and to switch the amplifier back on when the SPL exceeds the threshold. However, this method requires many circuit components, and involves the actual switching of amplifiers off and on.

Other attempts include logarithmic compression circuitry which produce adequate level controls, but minimal background sound compression effects, as well as require complex circuitry and many components.

In general, efforts have been directed toward controlling background sounds by directly modifying the automatic gain control circuits or amplifier circuits.

In the invention, background sound suppression circuitry operates on the signal before any automatic level control circuitry or user volume control circuitry. The invention requires no direct amplifier gain manipulations nor any on/off switching. The background sound suppression circuitry, however, does interact with the automatic level control circuitry and user volume control circuitry to produce the novel and useful background sound suppression result.

SUMMARY OF THE INVENTION

The foregoing and other problems of prior art background sound suppression circuitry for use in hearing aids are overcome by the present invention of hearing aid noise suppression apparatus comprising manually adjustable attenuating means and automatic signal level control means. The background sound suppression circuitry may be used in hearing aids having transducer means for converting sound signals into electrical signals, amplifier means for amplifying the electrical signals, and means for audibly reproducing the amplified signals. The manually adjustable attenuating means attenuate the electrical signals as they emerge from the transducer means. The automatic level control means operate upon the attenuated signals when the amplified electrical signals exceed a predetermined threshold value.

The invention permits the user to modify the response of the automatic level control (ALC) or automatic gain control (AGC) circuitry so that the difference in levels between close-in and background sounds is maintained. The invention also permits the user to attenuate the background sounds to a level below the user's hearing threshold. The invention permits user adjustment for a wide range of sound levels and in an infinite number of settings.

A related complaint of hearing aid users, is that even when there are no background sounds, there remains internal system noise. The invention eliminates such internal noise.

It is, accordingly, the object of the present invention to provide user controlled background noise and internal noise suppression means in a hearing aid system.

It is a further object of the present invention to provide such suppression capability using a minimum of components and without sacrificing effectiveness of control over a wide range of input levels.

It is a further object of the present invention to provide user controlled background sound suppression without degrading the fidelity of close-in sounds.

The foregoing and other objectives, features and advantages of the invention will be more readily understood upon consideration of the following detailed description of certain preferred embodiments of the invention, taken in conjunction with the accompanying drawings.

BRIEF DESCRIPTION OF THE DRAWINGS

FIG. 1 is a simplified functional block diagram of the present invention and illustrates the relationship of the invention to a hearing aid system.

FIG. 2 is a detailed schematic diagram of the preferred embodiment of the invention.

FIG. 3 is a graph illustrating the operation of the present invention.

DETAILED DESCRIPTION OF THE PREFERRED EMBODIMENT

FIG. 1 is a block diagram of a hearing aid system incorporating the noise suppression apparatus according to the invention. Audio sounds are received by a microphone 8 which converts them into corresponding electrical signals. These signals are amplified in a preamplifier 9. The amplified signals are then input into a user suppression adjust circuit (USAC) 10.

User Suppression Adjust Circuit (USAC)

USAC 10 permits the user to adjust the level of the signal into the subsequent automatic level control (ALC) circuitry 14 so that background sounds inaudible while close-in sounds remain audible.

Automatic Adjust Circuit (AAC)

After the signal level is modified in USAC 10, it is input into automatic adjust circuit (AAC) 4. AAC 4 is an element of ALC 14, described in detail below. AAC 4, in response to control signals from the shaping circuit of ALC 14, increases or decreases the level of the signal received from USAC 10 and applies it to the input of an amplifier 1.

Amplifier 1 has a fixed gain and functions as a driver amplifier to supply an output signal on line 15, which is amplified again by an operational amplifier 16A whose output is supplied, through a user gain control in the form of a voltage divider potentiometer 17, to a filter 16 and then output to the user 18. The output of amplifier 1 is also monitored by the level detector 2 of ALC 14.

Automatic Level Control (ALC)

ALC 14 comprises a level detector 2, a summing amplifier 3, an attack control 11, and AAC 4.

ALC 4 functions in the following manner: The output of amplifier 1 is monitored by level detector 2. Level detector 2 converts the alternating current waveform from amplifier 1, in excess of a predetermined threshold level of the level detector 2, into a corresponding control voltage (or signal). This control voltage (or signal) is applied to summing amplifier 3. There, the control voltage is added to the automatic adjust bias voltage line 12. (The bias voltage on line 12 serves to maintain the AAC 4 at a nominal setting when the output of amplifier 1 does not exceed the threshold of the level detector 2. When the level detector threshold has not been exceeded, ALC 14 is inoperative and the hearing aid functions in a straight amplification mode.)

Returning to summing amplifier 3, the effect of the output of the level detector 2 upon the automatic adjust bias level on line 12 is that when a level detector output is present, the automatic adjust bias level will be modified, hence the AAC 4 setting will be correspondingly modified. As used herein, "automatic adjust bias level" means the bias level for automatic adjust circuit 4.

The attack control 11, which is interposed between the output of summing amplifier 3 and AAC 4, regulates the rate at which voltages applied to AAC 4 change.

As the output from amplifier 1 increases above the level necessary to activate level detector 2, ALC 14 responds by causing AAC 4 to attenuate more of the signal level into amplifier 1, thus decreasing amplifier 1 output level. In this manner the output of amplifier 1 is maintained at a predetermined level, called the ALC limit level.

ACL 14 is a negative feedback loop. Therefore, the response of ALC 14 is to modify the value of AAC 4 so that the level allowed into amplifier 1 input results in an amplifier 1 output just below that necessary to activate level detector 2.

Functional Relationship Between USAC (10) and ALC (14)

User adjustment of USAC 10 determines the level from preamplifier 9 at which ALC 14 begins to function. Recall that level detector 2 requires that a certain minimum threshold level be present at the output of amplifier 1 before a non-zero output from level detector 2 is produced. Recall that USAC 10 modifies the level of the signal which is input into amplifier 1 (through AAC 4). By adjustment of USAC 10, the user thus regulates the ALC 14 response. When USAC 10 is adjusted for minimal suppression, ALC 14 limiting (attenuation by AAC 4) may be required for even low level sounds at microphone 8. On the other hand, when USAC 10 is adjusted for maximum suppression, higher levels of sound at microphone 8 are required before ALC 14 limiting is required. Note that in all cases the maximum output from amplifier 1 does not exceed the ALC 14 limit level.

The effect of USAC 10 upon the operation of the ALC 14 may be best appreciated by referring to FIG. 3. FIG. 3 illustrates the response of the ALC 14 to amplifier 1 input levels supplied by preamplifier 9, as modified by USAC 10. The horizontal axis represents the sound power levels emerging from preamplifier 9. Marked on the horizontal axis are points representing the power level of close-in sounds, as well as the power level of the background sounds. In this illustration, it is assumed that there is a measurable difference between the relative levels of the close-in sound and the background sound.

The vertical axis represents the sound level at the output of amplifier 1 as controlled by ALC 14. Marked on the vertical axis is the ALC limit level, as well as the hearing threshold of the user. The ALC limit level is assumed to be set just below the maximum comfort level of the user.

Curve A shows the response of the ALC 14 when USAC 10 is adjusted for minimal suppression. At the signal levels emerging from preamplifier 9, it can be seen that, while the desired sounds are at a level which causes the ALC 14 to become operational, the level of the background or undesired signal, subject to the full degree of amplification available in the circuit, is also amplified to a very high level. As a result, the difference (see difference A) between the desired signal and the undesired signal at the output of amplifier 1 has been drastically reduced, with respect to the difference between the signals at the output of preamplifier 9. The result is that the undesired signal has been amplified to a point approaching the maximum comfort level of the user, in addition to having attained a level almost as loud as the desired signals.

Curve B illustrates the ALC 14 response when the USAC 10 has been adjusted to provide some suppression. While there is still some limiting by the ALC 14 of the desired sound level, it can be seen that the output level of the undesired signal has been reduced both with respect to the user's maximum comfort level as well as with respect to the output level of the desired sound.

Curve C illustrates the ALC 14 response when the USAC 10 has been adjusted for moderate suppression. Here, the desired sound levels have not been subjected to limiting by the ALC 14. Therefore, the full difference between the desired sound level and the undesired sound level has been preserved. Note also that, while the level of the desired sounds remain close to the maximum comfort level, the level of the undesired signals has been reduced to a point which is below the user's hearing threshold level. As a result, the user is able to hear the desired sounds but not the undesired sounds. While FIG. 3 illustrates three possible ALC 14 responses for three USAC 10 conditions, there are numerous other responses available by the adjustment of USAC 10.

In summary, then, the USAC 10 permits the user to modify the ALC 14 response to various sound levels being processed by the hearing aid.

User Gain Control

The output of amplifier 1 is applied to a filter/amplifier 16A for shaping, a user gain control 17, another set of filters 16, and an earphone 18. The user gain control permits the user to adjust the output level of the hearing aid system above or below the ALC 14 limit level coming from amplifier 1.

Therefore, in general, the background sound suppression circuitry, comprising automatic signal level control means and manually adjustable attenuating means, is interposed between sound transducer means and amplifying means of a hearing aid system. The automatic signal level control means limit the signal levels into the amplifying means whenever the output of the amplifying means exceeds a predetermined threshold value. The manually adjustable attenuating means attenuate the signals emerging from the sound transducer means (which are thence supplied to the automatic signal lever control means for input into the amplifying means) so as to modify the response of the automatic signal level control means to provide suppression of background sounds with negligible effect on audibility of close-in sounds.

Referring now more particularly to FIG. 2, the level detector 2 comprises a full-wave rectifier and driver amplifier having unity gain. The anode of diode 19 and the cathode of diode 20 are connected to the output of amplifier 1 through AC-coupling capacitor 22. The cathode of diode 19 is connected to the negative input of driver amplifier 21 through a large resistance 23. The anode of diode 20 is connected directly to the positive input of driver amplifier 21. In this configuration, a positive going waveform at the output of amplifier 1 causes diode 19 to conduct (diode 20 is reverse biased and, therefore, non-conductive) which results in a negative-going waveform at the output of driver amplifier 21. On the negative going cycle of the amplifier 21 output, diode 19 is reverse biased while diode 20 conducts. This negative-going level at the positive input to driver amplifier 21 results in a negative-going waveform at its output. The value of feedback resistor 24, which is connected between the output and negative input of driver amplifier 21, is selected to be equal to that of resistor 23, thereby providing a unity inverting gain. The result of all of the above is a negative-going full-wave rectified signal at the output of driver amplifier 21 whenever the output of amplifier 1 exceeds the ALC threshold. The ALC threshold is determined by the minimum turn on voltages of diodes 19 and 20, approximately 400 mv.

The output of level detector 2 is connected to the summing amplifier 3. The summing amplifier 3 comprises an inverting amplifier 25 having two summing resistors 26, 27 connected to its negative input. The output of the level detector 2 is input into the summing amplifier through one of the resistors 26. The end of the other resistor 27 connects to the auto adjust bias voltage on line 12. The auto adjust bias voltage is derived from a voltage divider formed by potentiometer 13. The wiper of potentiometer 13 connects to line 12. One terminal of potentiometer 13 connects to a positive supply voltage while the other terminal connects to ground. The feedback resistor 28 which is connected between the output and negative input of inverting amplifier 25 is selected to provide a gain of approximately eight for the signals from the level detector 2, and a gain of approximately one for the auto adjust bias voltage. The output of summing amplifier 3 is, thus, equal to the negative of the quantity of eight times the level detector 2 output plus the automatic adjust voltage line 12.

The output of summing amplifier 3 is connected to the attack control circuitry 11. The attack control circuitry comprises resistors 29 and 30, diode 31 and capacitor 32. Resistor 29 connects the output of summing amplifier 3 to one end of resistor 30. The other end of resistor 30 is connected to one end of capacitor 32, the cathode of diode 31 and the input to AAC 4. The anode of diode 31 is connected to the junction of resistors 30 and 29. The other end of capacitor 32 is connected to ground. The junctions of diode 31, resistor 30 and capacitor 32 is connected to the input of AAC 4. In this configuration, the attack control circuitry 11 shapes the output of summing amplifier 25 using two distinct time constants. Whenever the output of summing amplifier 25 changes in a positive direction, the rate of change at the output of attack control circuit 11 is controlled by the time constant determined by resistor 29 and capacitor 32. In this positive-going direction, diode 31 conducts, thereby passing resistor 30.

When the output of summing amplifier 3 changes in the negative-going direction, diode 31 is reverse biased and, therefore, does not conduct. The output of attack control circuit 11 is, therefore, controlled by the time constant determined by the sum of resistors 29 and 30 and the value of capacitor 32.

The positive-going time constant is smaller than the negative-going time constant. Therefore, the response of the ALC 14 circuit to increases in amplifier 1 output level will be faster than its response to decreases in amplifier 1 output levels.

The values of resistors 29 and 30 and capacitor 32 are chosen so that the resulting time constants resemble typical rise and fall times of the human voice envelope; i.e., approximately 20 msec time constant for rise time, and 120 msec time constant for fall times.

AAC 4 comprises a field effector transistor (FET) 33. The gate of the FET 33 is the AAC 4 input. The FET source is connected to ground. The FET drain is the AAC 4 output and connects to the input of amplifier 1.

The FET 33 is operated with gate voltages on the order of a few hundred millivolts. When a negative (with respect to the FET source terminal) voltage of such magnitude is connected to the gate, the drain to source resistance may be varied over a range of a few hundred ohms to hundreds of thousands of ohms. The more positive the voltage the lower the resistance.

The ALC 14 functions in the following manner when USAC 10 is omitted from the circuit. When an amplifier 1 output level exceeds the diode thresholds of level detector 2, a negative-going level is output from driver amplifier 21. This negative-going level is combined with the auto adjust bias voltage, on line 12, in summing amplifier 3. As a result, the output of summing amplifier 3 is shifted in the positive direction. This positive shift is relayed to AAC 4 via the shorter time constant of attack control circuit 11. This positive change in voltage at the gate of FET 33 causes the resistance between the FET 33 drain and source to decrease correspondingly. This, in turn, reduces the input level to amplifier 1 so as to decrease the output level of amplifier 1.

A reduction in the drain-to-source resistance of FET 33 reduces the input level into amplifier 1 in the following manner: Resistor 7 connects the output of preamplifier 9 with the input of amplifier 1. With FET 33 connected between the amplifier 1 input and ground, a voltage divider is formed. The amount of the preamplifier 9 output supplied to the input to amplifier 1 is in proportion to the quotient of the drain-to-source resistance of FET 33 divided by the sum of resistor 7 and the drain-to-source resistance of FET 33. A reduction in the drain-to-source resistance of FET 33, therefore, results in a smaller input level into amplifier 1. An increase of such resistance likewise results in an increase of input level into amplifier 1. The above assumes that USAC 10 has been omitted from the circuitry.

Amplifier 1 comprises a non-inverting amplifier 34 having a gain of approximately 23.

To this point, what has been described is an amplifier circuit with automatic level control. It is the addition of the elements which follow, and their function in combination with the above circuitry, which provides a novel and useful result.

The user suppression adjust circuit 10 (USAC) comprises a user adjustable variable resistor 5 and a fixed resistor 6. The two are connected in series, with the other end of variable resistor 5 connected to the input of amplifier 1 and the other end of resistor 6 connected to ground. The USAC 10, together with AAC 4, form a voltage divider in conjunction with resistor 7. This voltage divider reduces the signal level from preamplifier 9 in the same proportion that the parallel conbination of USAC 10 and AAC 4 bears to the sum of the parallel combination of USAC 10 and AAC 4 plus resistor 7.

Whenever the value of either USAC 10 or AAC 4 is reduced, the signal level into amplifier 1 is reduced, and vice versa.

USAC 10 controls the operation of ALC 14 as follows: For ease of illustration, assume that there is no sound incident on microphone 8. There will then be no signal to be amplified by the hearing-aid system. There is thus no output from amplifier 1 and, therefore, no level detector 2 output. The summing amplifier 3 applies to the gate of FET 33 the full negative bias available from the auto adjust bias voltage on line 12. FET 33 is, therefore, in its maximum resistance mode.

Under these conditions, the voltage division function performed by resistor 7, USAC 10 and AAC 4 is dominated by the value of USAC 10 rather than AAC 4. Therefore, the value of USAC 10, as adjusted by the user, determines whether the signal level introduced into amplifier 1 after the voltage division (resistor 7, USAC 10, AAC 14) will be large enough, after amplification in amplifier 1, to (1) be audible by the user (after amplification and filtering in subsequent stages), and/or (2) exceed the threshold of the ALC 14 circuitry, to cause limiting.

The above results become significant when there is present: (1) two sounds of differing levels, (2) the sound desired to be heard having a higher level than the undesired sound, and (3) both sounds, after amplification by a hearing aid system without USAC 10, would be audible to the user. Under these circumferences, the hearing aid user is normally unable to tune out the undesired sounds.

By adjustment of USAC 10, the user may reduce the undesired sound levels below that which is audible to him or her. Given a large enough difference between the desired and undesired sounds (as is present when the source of the desired sounds is close-in), the desired sound would not be so reduced as to be inaudible to the user.

Graphically, as illustrated in FIG. 3, adjustment of USAC 10 causes the ALC input/output curve to move along the input axis. In this manner, the levels of the signals input to amplifier 1 may be adjusted so that instead of it being necessary for the ALC 14 to provide substantial limiting of the amplifier 1 output (see Curve A), the ALC 14 need provide only minimal limiting (see Curve C). Under some conditions, the full difference between the desired and undesired sounds may be utilized (see Curve C) to reduce, as much as possible, the level of the undesired sounds.

In other words, the response of the ALC 14 circuit to adjustment of USAC 10 is to shift the point on the curve about which the ALC 14 operates (for a given range of signal levels at preamplifier 9 output) from where the ALC 14 is operational most of the time, to one on the non-limiting, linear portion of the curve. See FIG. 3.

Assume the presence of a larger desired (or close-in) sound level and a smaller undesired (or background) sound level. Assume also that both sound levels are such that the ALC 14 is providing substantial limiting to the desired sound level output from amplifier 1, and that the resulting undesired sound level at the output of amplifier 1 is well above the user's hearing threshold. Variable resistor 5 is reduced in value by the user until it begins to dominate the voltage divider circuit, over the influence of the FET 33 resistance value. At this point, as the user begins to reduce the value of resistor 5 further, the signal levels into amplifier 1 will be reduced, and the ALC 14 will reduce its degree of limiting by increasing the resistance value of FET 33. This adjustment of resistor 5 will also reduce the level of the undesired signal at the output of amplifier 1.

The user then continues to reduce the value of resistor 5 until the unwanted sound becomes inaudible, or, in the case where the difference between the desired and undesired sounds is small, until just before the desired sound level becomes unaudible. In the latter case, although the undesired sounds are still audible, their level, at least, has been reduced.

In the former case, should the desired sound increase in magnitude, the ALC 14 circuit will provide limiting. Should the desired sound decrease in magnitude, the user may increase the value of resistor 5, or may increase the user gain control setting 17 to compensate.

In summary, the addition of the USAC 10 circuitry to the ALC 14 circuit permits user adjustment of the operating point on the ALC response curve. This permits the user to select the operating point on the ALC response curve which supplies maximum background sound suppression without sacrificing the audibility of the desired close-in sounds.

Fixed resistor 6 is selected to provide a maximum attenuation level, for the case where the value of variable resistor 5 has been adjusted to zero. This maximum attenuation eliminates internal electrical system noise yet permits louder external sounds to be amplified.

The use of a variable resistor 5 permits the user to adjust the ALC operating point to an infinite number of positions.

The use of a voltage-divider attenuating circuit to control the level of signal amplified by amplifier 1 provides linear attenuation, hence little distortion.

The selection of time constants in the attack control circuit 11 which conform to typical human speed envelopes permits the ALC 14 to "track" changes in voice level of human speech.

Finally, in order to compensate for the delay in the ALC 14 response when the ALC 14 goes from a full off to a full on mode; i.e., from a no-limiting to a hard-limiting condition, diodes 35 and 36 are connected between output line 15 and ground. The anode of diode 35 is connected to ground while its cathode is connected to line 15. The cathode of diode 36 is connected to ground while its anode is connected to line 15. These diodes act to clip, to a level of approximately 500 mv, the initial large output level from amplifier 1, which results from the turn on delay of the ALC 14 circuitry.

While the preferred embodiment of the present invention is directed to an improved hearing aid system, the suppression circuitry is nevertheless useful in sound amplification systems in general, for example public address systems, where both the automatic level control of amplified signals and the suppression of background sounds are desirable.

The terms and expressions which have been employed here are used as terms of description and not of limitations, and there is no intention, in the use of such terms and expressions of excluding equivalents of the features shown and described, or portions thereof, it being recognized that various modifications are possible within the scope of the invention claimed.

What is claimed is:

1. An improved sound amplifying apparatus of the type which includes transducer means for converting sound signals into electrical signals, amplifying means, and means for audibly reproducing electrical signals, wherein the improvement is a selective signal level suppression circuit, the suppression circuit comprising:

manually adjustable attenuating means responsive to electrical signals from the transducer means for selectively attenuating the transducer electrical signals; and automatic signal level control means, responsive to the attenuated transducer signals and to amplified signals from the amplifying means, for supplying the attenuated transducer signals to the amplifying means for amplification; the automatic signal level control means having means for limiting the level of the attenuated transducer signal which are supplied to the amplifying means to maintain the level of the amplified attenuated transducer signals from the amplifying means at no greater than a predetermined threshold value, whereby adjustment of the attenuation provided by the manually adjustable attenuating means modifies the response of the signal level suppression circuit to the transducer electrical signals by altering the magnitude required in the transducer electrical signals before level limiting of the attenuated transducer signal will occur in the automatic signal level control means.

2. The combination of claim 1, wherein the apparatus generates internal electrical signal noise, wherein the manually adjustable attenuating means can be adjusted to a predetermined maximum attenuating value, and wherein at said value there is sufficient attenuation of the internal electrical noise supplied to the amplifying means by the manually adjustable attenuating means to prevent audible reproduction of the amplified electrical noise, while simultaneously allowing the electrical signals from the transducer means to be audibly reproduced.

3. The combination of claim 2, further comprising a first resistance and wherein the electrical signals are supplied to the amplifying means through the first resistance, and wherein the manually adjustable attenuating means comprise a variable resistance connected in series with a second, fixed resistance, and wherein the first resistance and the variable and second resistances form a voltage divider, so that an increase in value of the variable resistance causes a decrease in the proportion of electrical signal dissipated by the first resistance and a corresponding increase in proportion of electrical signal supplied to the amplifying means, while a decrease in value of the variable resistance causes an increase in the proportion of electrical signal dissipated by the first resistance and a corresponding decrease in the proportion of electrical signal supplied to the amplifying means, the value of the second resistance being selected to fix a maximum proportion of electrical signal which will be dissipated in the first resistance when the variable resistance is adjusted to a zero resistance value.

4. The combination of claims 2 or 3, wherein the automatic signal level control means comprise:

level detecting means, responsive to the amplified electrical signal level, for producing a control signal when the amplified electrical signal level exceeds a predetermined value, wherein the control signal has a magnitude representative of the amount by which the predetermined value has been exceeded;

automatic attenuating means supplied with the control signal, the automatic attenuating means connected in parallel with the manually adjustable attenuating means for attenuating the electrical signals in response to the control signal.

5. The combination of claim 4, wherein the level-limited signals have high level transients, further comprising spike suppression means, interposed between the amplifier means and the reproducing means, for suppressing the high level tranients in the level-limited signals.

* * * * *